United States Patent [19]

Kling et al.

[11] 4,379,690
[45] Apr. 12, 1983

[54] PHOTOFLASH SWITCHING ARRAY AND FABRICATION UTILIZING SILVER-OXIDE COATED SOLIDS

[75] Inventors: Michael R. Kling, White Deer; Carl F. Kackenmeister, Williamsport, both of Pa.

[73] Assignee: GTE Products Corporation, Stamford, Conn.

[21] Appl. No.: 292,372

[22] Filed: Aug. 13, 1981

[51] Int. Cl.³ .............................................. F21K 5/00
[52] U.S. Cl. ................................. 431/359; 252/501.1; 252/514; 362/6; 362/15
[58] Field of Search .................... 431/359; 252/501.1, 252/514; 362/4, 6, 13, 15

[56] References Cited

U.S. PATENT DOCUMENTS

| | | | |
|---|---|---|---|
| 4,182,608 | 1/1980 | Chevali et al. | 252/514 |
| 4,320,440 | 3/1982 | Brower et al. | 431/359 |
| 4,330,821 | 5/1982 | Brower et al. | 431/359 |
| 4,336,570 | 6/1982 | Brower et al. | 431/359 |

Primary Examiner—Carroll B. Dority, Jr.
Attorney, Agent, or Firm—Thomas H. Buffton

[57] ABSTRACT

A sequentially operable multilamp photoflash array includes a plurality of radiation-responsive normally open (N/O) connect type switches which are prepared from a composition which includes a filler material, a binder, silver coated particulate solids and silver-salt coated particulate solids. The switches are fabricated by a process wherein the silver coated particulate solids are stirred in potassium permanganate, added to an admixture of silver coated glass beads, a filler material and an organic binder and deposited onto a printed circuit board.

24 Claims, 4 Drawing Figures

PHOTOFLASH SWITCHING ARRAY AND FABRICATION UTILIZING SILVER-OXIDE COATED SOLIDS

TECHNICAL FIELD

This invention relates to photoflash arrays utilizing thermally activated switches to provide sequential operation and more particularly to a photoflash array and fabrication process employing silver-salt coated particulate solids in thermally activated switches.

BACKGROUND ART

Numerous multilamp photoflash arrangements with various types of sequencing circuits have been described in the prior art, particularly in the past few years. Series and parallel-connected lamp arrays have been shown which are sequentially fired by mechanical switching means, simple electrical circuits, switching circuits using the randomly varied resistance characteristics of the lamps, arc gap arrangements, complex digital electronic switching circuits, light-sensitive switching means and heat-sensitive switching devices which involve melting, fusing or chemical reaction in response to the radiant energy output of a proximate flashed lamp. The present invention is concerned with an improved radiant-energy-activated switching means useful in a relatively inexpensive photoflash unit of the disposable type. In particular, the present switching means is particularly advantageous in photoflash arrays employing high voltage type lamps adapted to be ignited sequentially by successively applied high voltage firing pulses from a source such as a camera-shutter-actuated piezoelectric element.

A currently marketed photoflash unit of the last-mentioned type is described in U.S. Pat. No. 3,894,226 and referred to as a flip flash. The unit comprises a planar array of eight high voltage type flashlamps mounted on a printed circuit board with an array of respectively associated reflectors disposed therebetween. The lamps are arranged in two groups of four disposed on the upper and lower halves, respectively, of the rectangular shaped circuit board. A set of terminal contacts at the lower end of the unit is provided for activation of the upper group of lamps, while a set of terminal contacts at the top of the unit is operatively associated with the lower group of four lamps. The application of successive high voltage pulses (e.g., 500 to 4000 volts from, say, a piezoelectric source controlled by the shutter of a camera in which the array is inserted) to the terminal contacts at the lower end of the unit causes the four lamps at the upper half of the array to be sequentially-ignited. The array may then be turned end for end and again inserted into the camera in order to flash the remaining four lamps.

The flip flash circuit board comprises an insulating sheet of plastic having a pattern of conductive circuit tracers, including the terminal contacts, on one side. The flashlamp leads are electrically connected to these circuit traces by means of eyelets secured to the circuit board and crimped to the lead wires. The circuitry on the board includes six printed, normally open, connect switches that chemically change from a high to low resistance, so as to become electrically conducting, after exposure to the radiant heat energy from an ignited flashlamp operatively associated therewith. The purpose of these switches is to promote lamp sequencing and one-at-a-time flashing. The four lamps of each group are arranged in parallel, with three of the four lamps being connected in series with a respective thermal connect switch. Initially, only the first of the group of four lamps is connected directly to the voltage pulse source. When this first lamp flashes, it causes its associated thermal connect switch (which is series connected with the next, or second lamp) to become permanently conductive to high voltage. Because of this action, the second lamp of the group of four is connected to the pulse source. This sequence of events is repeated until all four lamps have been flashed.

One type of radiation actuated connect switch is described in U.S. Pat. No. 3,459,488 of Schroder et al, in which a paste globule containing a metal compound dissociates to form an electrical conductive bridge in response to actinic light radiation. In U.S. Pat. No. 3,458,270 of Ganser et al, the use of silver oxide in a polyvinyl binder is taught as a normally open radiant energy switch. Upon radiant heating, the silver oxide decomposes to give a metallic silver residue which is electrically conductive. More recently silver carbonate has been favored over silver oxide for this use because of its lower conductivity toward high voltage prior to thermal actuation. Some other related patents include the following: U.S. Pat. Nos. 3,598,511, 3,726,631, 3,728,067, 3,728,068, 3,692,995, 3,774,020, 3,532,931, 3,459,487, 3,668,421, 3,562,508, 3,443,875, 3,951,582, 3,969,065 and 3,969,066.

Also, it is known that the above-mentioned normally open (N/O) radiation-responsive switches utilizing a paste containing silver oxide or silver carbonate tend to react vigorously to conversion from a normally open condition to a conductive condition. As a result, the switching device is susceptible to be "blown off" the circuit board and thereby fail to provide the desired low resistance electrical path.

One attempt to eliminate the above-described "blow off" problem is suggested in U.S. Pat. No. 4,080,155 issued to Sterling. Therein, a mixture of silver oxide and a suitable carbon-containing silver salt are utilized with non-conductive particulate solids, such as glass beads, to provide a slurry or paste suitable for use in fabricating a N/O switch for a sequentially operable multilamp photoflash array.

Although the above-described N/O switches employing silver oxide and a silver-salt with non-conductive particulate solids have been used with varying results, it has been found that such switches tend to require a relatively large quantity of silver. For example, a silver salt content of more than 50% by weight is not uncommon. Moreover, the cost of switches utilizing such large amounts of silver tends to be prohibitive or at least very undesirable.

OBJECTS AND SUMMARY OF THE INVENTION

Accordingly, it is an object of the present invention to provide an improved sequentially operable multilamp photoflash array having a multiplicity of radiation-responsive switches therein. Another object of the invention is to provide an enhanced switching capability for a multilamp photoflash array. A further object of the invention is to provide an improved normally open (N/O) radiation-responsive switch for a sequentially operable multilamp photoflash array. A still further object of the invention is to provide an improved process for fabricating radiation-responsive switches for sequentially operable multilamp photoflash arrays.

These and other objects, advantages and capabilities are achieved in one aspect of the invention by a sequentially operable multilamp photoflash array with a plurality of radiation-responsive switches having an admixture of filler material, binder, silver-coated non-conductive particulate solids and silver-oxide coated non-conductive particulate solids.

In another aspect of the invention, a radiation-responsive normally open (N/O) switch for a photoflash array includes silver-coated glass beads, a filler material, a binder and silver-oxide coated glass beads. Moreover, the above-mentioned radiation-responsive switches are fabricated by a process wherein silver coated glass beads are stirred in a potassium permanganate solution to provide silver-oxide covered glass beads, the silver-oxide covered glass beads are added to an admixture of filler, binder and silver coated glass beads to provide a switch paste and this switch paste is deposited onto a printed circuit board to provide a radiation-responsive switch.

BEST MODE FOR CARRYING OUT THE INVENTION

For a better understanding of the present invention, together with other and further objects, advantages and capabilities thereof, reference is made to the following disclosure and appended claims in conjunction with the accompanying drawings.

Figure 1:
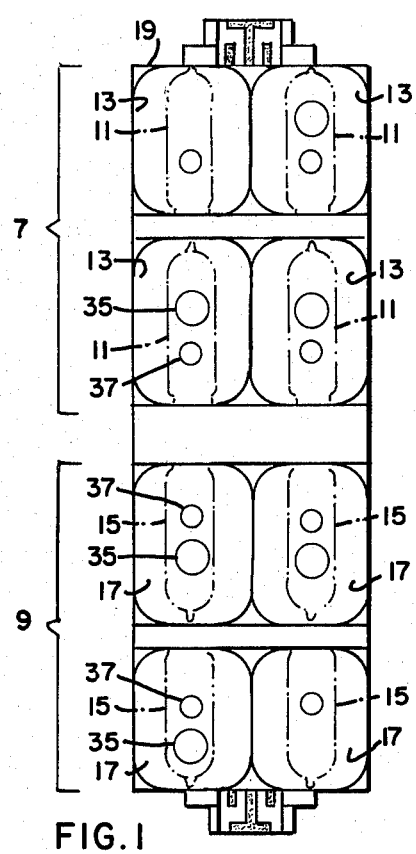
FIG. 1 is a front elevational view of a multilamp photoflash array with the flashlamps illustrated by phantom lines.
Figure 2:
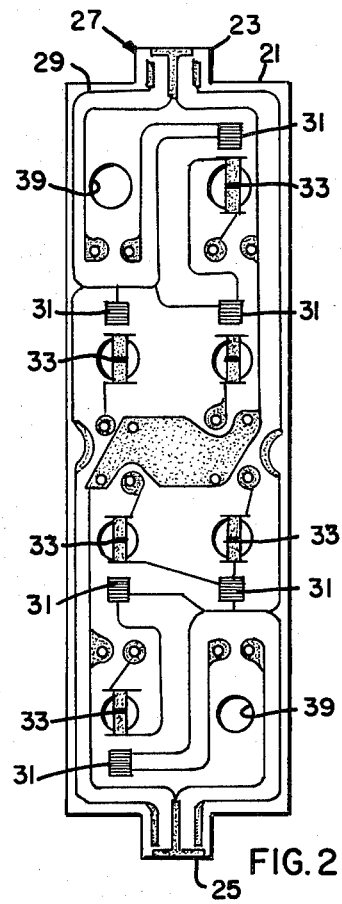
FIG. 2 is an elevational view of the printed circuit board, including normally open (N/O) radiation-responsive switches, for a sequentially operated photoflash array.

Referring to the drawings, FIGS. 1 and 2 illustrate a preferred form of sequentially operable multilamp photoflash array. Therein, a planar array of eight flashlamps includes a first group 7 and a second group 9. The first group 7 includes four flashlamps 11 each having an associated reflector 13 and the second group 9 having four substantially identical flashlamps 15 each having an associated reflector.

A box-like plastic container 19 which may include two pieces of plastic attachable to one another or a single foldable plastic structure encloses the above-mentioned components. Also, the plastic container 19 includes clear light transmittable portions in front of the flashlamps 11 and 15 and these light transmittable portions may be tinted for color corrections purposes in a manner well-known in the art.

A printed circuit board 21 is disposed adjacent to and on the side of the reflectors 13 and 17 opposite to the light transmittable portions of the plastic container 19. This printed circuit board 21 has first and second oppositely disposed connector tabs 23 and 25 respectively which are each formed for attachment to a camera to provide opposite orientation of the array with respect to a camera.

Affixed to the printed circuit board 21 is a "printed circuit" 27 for distributing electrical energy, provided by an energizing source in a camera, to the flashlamps 11 and 15 of the array. The printed circuit 27 includes a plurality of electrically conductive circuit runs 29 which may be affixed to the circuit board 21 in any one of a number of well-known ways, such as silk screening or die-stamping processes, for example. Moreover, these electrically conductive circuit runs 29 extend onto the connector tabs 23 and 25 to provide the interface connections between a camera and the printed circuit 27.

Also affixed to the circuit board 21 and electrically connected to the electrically conductive circuit runs 29 are a plurality of normally open (N/O) switches 31 and a plurality of normally closed (N/C) switches 33. The normally open switches 31 are of the radiation-responsive type or connect type wherein the switch 31 presents a high resistance to electrical conductivity and, upon exposure to radiant energy from a nearby flashlamp, is rendered electrically conductive to provide a relatively low resistance path for electrical conductivity. The normally closed (N/C) switches 33 are of the disconnect type and upon exposure to radiation are rendered non-conductive to electrical energy.

Figure 3:
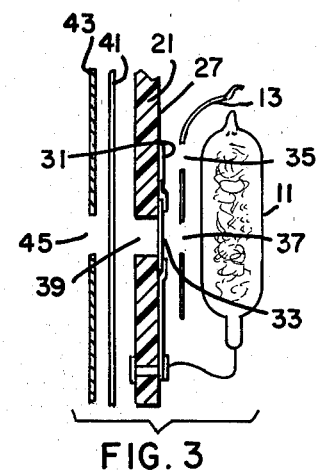
FIG. 3 is a schematic illustration of a photoflash array showing the relationship of a photolamp, switches, reflector and flash indicator of a photoflash array.

As can be more easily seen in FIG. 3, each of the flashlamps 11 is affixed to the electrically conductive runs 29 on the circuit board 21. Also, the reflectors 13 each have a first aperture 35 aligned with a N/O switch 31 on the circuuit board 21 and a second aperture 37 aligned with each of the N/C switches 33. Moreover, the N/C switches 33 bridge an opening 39 in the circuit board 21.

Immediately adjacent to and on a side of the circuit board 21 opposite the flashlamps 11 and 13 is a sheet of flash indicator material 41 covered by an indicia sheet 43. The flash indicator material 41 may be a heat shrinkable material, such as biaxially oriented polypropylene, which shrinks or melts upon exposure to heat. Also, the indicia material 43 includes an aperture 45 aligned with the normally closed (N/C) switch 33.

In a manner well known in the art, the normally closed (N/C) disconnect switches 33 each have a length of electrically conductive heat shrinkable material attached at both ends to the printed circuit 27 and bridging the opening 39 in the circuit board 21. Upon exposure to radiation from one of the adjacent flashlamps 11, the heat shrinkable material separates to effect the desired quick-disconnect features of the normally closed (N/C) switch 33.

Additionally, activation of the quick-disconnect or normally closed switch 33 causes radiation from the flashlamp 13 to impinge the sheet of flash indicator material 41. Thereupon, that portion of the sheet of flash indicator material 41 opposite the normally closed switch 33 is energized and altered in a manner which is readily observed by way of an aligned aperture 45 of the indicia material 43.

Referring more specifically to the normally open or connect switches 31, it has been mentioned that it is known to fabricate radiation-responsive connect switches 31 from a paste which includes silver oxide or silver carbonate, an organic binder and a filler material. Also, it has been mentioned that connect switches 31 are fabricated from a paste which includes a silver salt, a filler material, an organic binder and silver-coated glass beads. However, it has also been noted that connect switches having a silver salt present are subject to "blow off" or complete removal from the support resulting in an electrical contact failure while connect switches which include a silver salt and silver-coated glass beads generally require an excessive amount of relatively expensive silver.

It has now been found that connect or normally open (N/O) switches 31 may be fabricated from an admixture which includes a filler material, an organic binder, silver-coated non-conductive particulate solids and silver-salt coated non-conductive particulate solids. Moreover, the non-inductive particulate solids are preferably in the form of glass beads having a silver coating in the range of about 4 to 8% by weight, of a size in the range of about 5 to 45 microns and available from Potters Industries Incorporated, Hasbrouck Heights, N.J.

The binder material is an organic binder such as polystyrene or Pliolite S-5D in equal parts in butyl cellosolve acetate (BCA). However, other organic binder materials are also suitable. For example, cellulose esters, cellulose ethers, polyalkylacrylates, styrene copolymers, vinyl polymers and polycarbonates are also suitable and appropriate to the admixture.

The filler material is preferably titanium dioxide ($TiO_2$), although materials such as glass spheres, alumina, silica, and glass frit are also suitable. Also, the silver-coated glass particulate solids are preferably glass beads designated S-3000-S by the previously-mentioned Potters Industries and having a silver coating in the range of about 4 to 8% by weight.

As to the silver-salt coated non-conductive particulate solids, the preferred solids are glass beads designated S-5000-S by Potters Industries and of a size less than about 37 microns. A preferred form of particulate solid is silver-oxide coated glass beads derived from silver-coated glass beads having a coating of silver in the range of about 4 to 8% by weight. In a preferred technique, these silver-coated glass beads are oxidized in a stoichiometric one hundred milliliters solution of potassium permanganate ($KMnO_4$) in accordance with the following reaction:

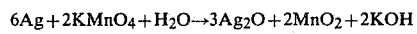

$$6Ag + 2KMnO_4 + H_2O \rightarrow 3Ag_2O + 2MnO_2 + 2KOH$$

In fabricating a switch paste suitable to the formation of a connect or normally open (N/O) switch 31, silver coated glass beads are stirred in a stoichiometric solution of potassium permanganate ($KMnO_4$) to provide silver-oxide coated glass beads. The silver-oxide coated glass beads are added to an admixture of silver coated glass beads, a filler material and an organic binder to make a radiation-responsive switch paste. Thereafter, the switch paste is deposited or applied to a printed circuit board to provide the desired connect or normally open (N/O) radiation-responsive switch 31.

Further, the above-described switch paste includes glass beads coated with about 4 to 8% silver and of an amount in the range of about 0 to 25%, a filler material in the range of about 0 to 10%, a binder material in the range of about 3 to 15% and silver-oxide coated glass beads in the range of about 65 to 90%. In a preferred composition, about 75% of silver oxide coated glass beads was mixed with about 17% silver coated glass beads, about 3% titanium dioxide ($TiO_2$) and about 5% of equal parts of polystyrene and Pliolite in butyl cellosolve acetate (BCA).

Figure 4:
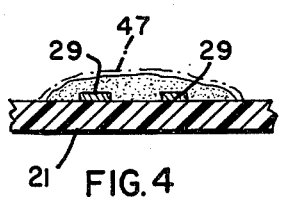
FIG. 4 illustrates a normally open (N/O) radiation-responsive switch of the invention.

An example of one such normally open (N/O) connect type switch 31 is illustrated in FIG. 4. Herein, a pair of electrically conductive circuit runs 29 of a printed circuit 27 are positionally located on a printed circuit board 21. Deposited on the circuit board 21 and in overlapping relationship to the pair of electrically conductive circuit runs 29 is a switch paste 47 which forms the above-mentioned switch 31.

Additionally, a switch paste was prepared by stirring 65 grams of silver-oxide coated glass beads, 25 grams of silver coated glass beads, 5 grams of titanium dioxide ($TiO_2$) and 25 grams of binder solution containing 2.5 grams each of polystrene and Pliolite S-5D in butyl cellosolve acetate (BCA). The paste was thinned with BCA and deposited onto a printed circuit of a sequentially operable multilamp photoflash array.

A lot of 5000 of the above-described sample switches were assembled and sampled with 200 samples flashed and no switch failures encountered. Also, it was found that switches fabricated as described above had a preconversion resistance of over 20 megohms and a post conversion resistance in the range of about 1000 ohms to 20 megohms. Moreover, these switches exhibited a preconversion breakdown voltage greater than about 2200 volts and a post conversion breakdown voltage in the range of about 200 to 600 volts.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

An enhanced sequentially operable multilamp photoflash array includes a plurality of improved radiation-responsive normally open (N/O) connect switches. The switches include silver salt coated non-conductive particulate solids whereby the tendency to undesired "blow off" is reduced. Also, the silver requirements and switch material costs are significantly reduced whereby an improved product is provided at reduced material cost. Moreover, a process is provided for manufacturing switches utilizing the above-mentioned silver salt coated non-inductive particulate solids.

We claim:

1. A multilamp photoflash sequential array having at least one radiation-responsive switch including an admixture of a filler material, a binder, silver-coated non-conductive particulate solids and characterized by the improvement wherein said admixture includes silver-salt coated non-conductive particulate solids.

2. The sequential array of claim 1 wherein said silver-salt coated non-conductive particulate solids are in the form of silver-oxide coated glass beads.

3. The sequential array of claim 1 wherein said silver-salt coated non-conductive particulate solids are in the form of glass beads coated with silver oxide derived from glass beads coated with silver in the range of about 4 to 8% by weight.

4. The sequential array of claim 1 wherein said filler material of said admixture is in the form of titanium dioxide ($TiO_2$).

5. The sequential array of claim 1 wherein said binder is in the form of an organic polymer.

6. The sequential array of claim 1 wherein said binder is in the form of a solution of equal parts of polystyrene and Pliolite (S-5D) in butyl cellosolve acetate (BCA).

7. The sequential array of claim 1 wherein said admixture includes silver-coated glass beads in the range of about 0 to 25%; filler material in the range of about 0 to 10%; binder in the range of about 3 to 15%; and silver-oxide coated glass beads in the range of about 65 to 90%.

8. The sequential array of claim 1 wherein said admixture includes about 17% silver-coated glass beads (4 to 8% silver); about 3% titanium dioxide (TiO$_2$); about 5% equal parts of polystyrene and Pliolite binder; and about 75% silver-oxide coated glass beads (4 to 8% silver).

9. The sequential array of claim 1 wherein said radiation-responsive switch has a preconversion resistance of over 20 megohms and a post conversion resistance in the range of about 1000 ohms to 20 megohms.

10. The sequential array of claim 1 wherein said radiation-responsive switch has a preconversion breakdown voltage greater than about 2200 volts.

11. The sequential array of claim 1 wherein said radiation-responsive switch has a preconversion breakdown voltage greater than about 2200 volts and a post conversion breakdown voltage less than about 600 volts.

12. A radiation-responsive switch for a multilamp photoflash array and fabricated from an admixture of filler material, binder material, silver-coated non-conductive particulate solids and characterized by the improvement of the addition of silver-salt covered non-conductive particulate solids.

13. The radiation-responsive switch of claim 12 wherein said silver-salt covered non-conductive particulate solids are in the form of glass beads with a covering of about 4 to 8% silver.

14. The radiation-responsive switch of claim 12 wherein said silver-salt covered non-conductive particulate solids are in the form of glass beads with about 4% silver coating.

15. The radiation-responsive switch of claim 12 wherein said admixture includes about 0.25% silver-coated glass beads, about 0 to 10% filler material, about 3 to 15% binders, and about 65 to 90% silver-oxide coated glass beads.

16. The radiation-responsive switch of claim 12 wherein said admixture includes about 17% silver-coated glass beads (4% silver); about 3% titanium dioxide (TiO$_2$); about 5% of equal parts of polystyrene and Pliolite S-5D binder; and about 75% silver-oxide coated glass beads (4% silver).

17. The radiation-responsive switch of claim 12 wherein said switch has a preconversion resistance of over 20 megohms and a post conversion resistance in the range of about 1000 ohms to 20 megohms.

18. The radiation-responsive switch of claim 12 wherein said switch has a preconversion breakdown voltage greater than about 2200 volts and a preconversion resistance of over 20 megohms and a postconversion breakdown voltage less than about 600 volts with a postconversion resistance in the range of about 1000 ohms to 20 megohms.

19. A radiation-responsive switch fabricating process comprising the steps of:
   stirring silver-coated glass beads in a stoichiometric solution of potassium permanganate (KMnO$_4$) to provide silver-oxide coated glass beads;
   adding said silver-oxide coated glass beads to an admixture of silver-coated glass beads, a filler material and an organic binder to provide a switch paste; and
   depositing said switch paste onto a printed circuit board to provide a plurality of radiation-responsive switches.

20. The fabricating process of claim 19 wherein said silver-coated beads stirred in said stoichiometric solution of KMnO$_4$ react in accordance with the following formulation:

$$6Ag + 2KMnO_4 + H_2O \rightarrow 3Ag_2O + 2MnO_2 + 2KOH$$

21. The fabricating process of claim 19 wherein about 75% of silver-oxide coated glass beads was added to about 17% of silver coated glass beads, about 3% titanium dioxide (TiO$_2$), and 5% of binder in equal amounts of polystyrene and Pliolite dissolved in butyl cellosolve acetate (BCA).

22. The fabricating process of claim 19 wherein said silver-oxide coated glass beads are derived from silver-coated glass beads coated with silver in the range of about 4 to 8% by weight.

23. The fabricating process of claim 19 wherein silver-oxide coated glass beads in the range of about 65 to 90% are added to silver coated glass beads in the range of about 0 to 25%, titanium dioxide (TiO$_2$) in the range of about 0 to 10%, and binder in the range of about 3 to 15%.

24. The fabricating process of claim 19 wherein said glass beads having a silver-oxide coating thereon are of a particle size in the range of about 37 microns and less.

* * * * *